(12) United States Patent
Frydel

(10) Patent No.: US 6,834,024 B2
(45) Date of Patent: Dec. 21, 2004

(54) REDUCED SIZE MULTI-PORT REGISTER CELL

(75) Inventor: Gene K. Frydel, Austin, TX (US)

(73) Assignee: IP-First, LLC, Fremont, CA (US)

( * ) Notice: Subject to any disclaimer, the term of this patent is extended or adjusted under 35 U.S.C. 154(b) by 104 days.

(21) Appl. No.: 10/279,209

(22) Filed: Oct. 22, 2002

(65) Prior Publication Data
US 2003/0214848 A1 Nov. 20, 2003

Related U.S. Application Data
(60) Provisional application No. 60/345,459, filed on Oct. 23, 2001.

(51) Int. Cl.[7] .................................................. G11C 8/00
(52) U.S. Cl. .............................. 365/230.05; 365/189.04
(58) Field of Search ....................... 365/189.04, 230.05; 711/147, 149

(56) References Cited
U.S. PATENT DOCUMENTS

| | | | |
|---|---|---|---|
| 5,189,640 A | 2/1993 | Huard | |
| 5,574,935 A | * 11/1996 | Vidwans et al. | ............... 712/23 |
| 5,590,087 A | 12/1996 | Chung et al. | |
| 5,777,928 A | 7/1998 | Vidwans et al. | |
| 5,813,037 A | 9/1998 | Martell et al. | |
| 6,208,565 B1 | 3/2001 | Riedlinger et al. | |
| 6,370,623 B1 | * 4/2002 | Mehra et al. | ............... 711/149 |

* cited by examiner

Primary Examiner—Son T. Dinh
(74) Attorney, Agent, or Firm—E. Alan Davis; James W. Huffman

(57) ABSTRACT

A multi-ported register cell that reduces the number of metal wires and/or transistors per write port. The cell includes a storage element that stores a bit. Each write port includes three transistors and two wires. The first transistor is coupled to a true input of the storage element. The second transistor is coupled to a complement input of the storage element. The first wire selectively turns on the first and second transistors of one of the ports. The second wire provides the update value. The third transistor selectively couples the second transistor to ground depending upon whether the second wire turns on the third transistor, thereby providing a complement of the update value to the second transistor. The cell also includes one or more read ports for reading the storage element bit. A multi-ported register file may be created from the cells.

40 Claims, 6 Drawing Sheets

REDUCED SIZE MULTI-PORT REGISTER CELL

This application claims priority based on U.S. Provisional Application, Ser. No. 60/345,459, filed Oct. 23, 2001, entitled MULTI.WRITE.PORT REGISTER FILE CELL OF REDUCED SIZE.

FIELD OF THE INVENTION

This invention relates in general to the field of semiconductors, and particularly to multi-ported semiconductor register cells.

BACKGROUND OF THE INVENTION

Digital circuits commonly employ registers that store data. In particular, microprocessors typically include a set of registers, commonly referred to as a register file, for storing instruction operands and results. An example of a microprocessor register file is a floating-point register file, which is an array of registers for holding operands and results of a floating-point unit. The floating-point register file can be relatively large. For example, the user-visible floating-point register file for an x86 architecture floating-point unit comprises eight 80-bit registers.

Typically, there are multiple functional blocks within a microprocessor that require access to a register file. One reason for this is that modern microprocessors are typically pipelined. That is, the processor includes multiple stages, each of which executes a portion of an instruction as it moves through the stage. Consequently, the processor is executing multiple instructions at the same time. As a result, multiple functional blocks within the various stages of the pipeline may need to read data from and write data to the register file. For example, a cache within the processor may need to write data to the register file or read data from the register file. Similarly, the arithmetic and logic units in the processor need to read and write data from and to the register file. Still further, stages that transfer data between the processor and memory require access to the register file.

Frequently, the various functional blocks within the processor need to access the register file simultaneously, i.e., during the same clock period. If the register file is designed to only allow one functional block to access the register file at a time, then the other functional blocks needing access must wait. This can be detrimental to performance since it may cause various stages in the pipeline to stall waiting for the functional block to access the register file, which defeats the advantages of the pipelined nature of the processor.

To address this problem, processors typically include multi-ported register files. A multi-ported register file includes multiple read and write ports that make the register file capable of being read from and written to by multiple functional blocks simultaneously.

For example, assume a register file has at least four write ports and two read ports. From such a register file, a data cache might write data to a first register in the register file, a first arithmetic logic unit might write an instruction result to a second register, a second arithmetic logic unit might write another instruction result to a third register, a third arithmetic logic unit might write another instruction result to a fourth register, a store stage might read an instruction result from a fifth register for writing to memory, and an address generator might read an address operand from a sixth register, all in the same clock cycle.

Multi-ported register files are made up of multi-port register cells. Each multi-port register cell stores one bit. The multi-port cells are coupled together to form a register, and the registers are arranged together into the register file. Each multi-port register cell has multiple write ports and multiple read ports. The ports include metal wires that carry data and control signals to the cell for reading and writing the cell. The data and control signals are coupled to transistors in the register cell that store the bit value or act as control logic to determine which ports will read and write the cell.

A problem with conventional multi-port register cells that are used to create multi-port register files is extreme metal wire congestion in the register file due to the large number of wires that accompany the large numbers of ports. The congestion creates routing and space problems in the register file.

In a typical cell, the size of the semiconductor layers that make up the transistors comprising the cell dictate the size of the cell. Another problem in some conventional multi-port register cells is that the large number of metal wires may dictate the size of the cell, rather than the size of the semiconductor layers. Some conventional register cells attempt to alleviate this problem and the wire congestion problem by reducing the number of metal wires, but do so by adding transistors, thereby increasing the cell size.

Therefore, what is needed is a register cell that is smaller and has a reduced number of metal wires.

SUMMARY

The present invention provides a register cell that reduces the number of metal wires over most conventional register cells without increasing the number of transistors. Accordingly, in attainment of the aforementioned object, it is a feature of the present invention to provide a register cell. The register cell includes a storage element with true and complement inputs. The register cell also includes N write circuits. Each of the N write circuits is coupled to the storage element. Each of the N write circuits includes a first input wire that transmits a binary value to write into the storage element. Each of the N write circuits also includes a first transistor, coupling the first input wire to the true input. Each of the N write circuits also includes second and third transistors, coupled in series to the complement input. The first input wire is also coupled to the third transistor to selectively turn on the third transistor to provide a complement of the binary value to the second transistor. Each of the N write circuits also includes a second input wire, coupled to the first and second transistors, that selectively turns on the first and second transistors to selectively enable writing the binary value to the storage element.

In another aspect, it is a feature of the present invention to provide a register cell. The register cell includes a storage element with true and complement inputs. The register cell also includes N write circuits. Each of the N write circuits is coupled to the storage element. Each of the N write circuits consists essentially of first and second input wires and first, second, and third transistors. The first input wire transmits a binary value to write into the storage element. The first transistor couples the first input wire to the true input. The second and third transistors are coupled in series to the complement input. The first input wire is also coupled to the third transistor to selectively turn on the third transistor to provide a complement of the binary value to the second transistor. The second input wire is coupled to the first and second transistors and selectively turns on the first and second transistors to selectively enable writing the binary value to the storage element.

In another aspect, it is a feature of the present invention to provide a register cell. The register cell consists essentially of a storage element with true and complement inputs, N write circuits and M read circuits, each coupled to the storage element. Each of the N write circuits includes a first input wire that transmits a binary value to write into the storage element. Each of the N write circuits also includes a first transistor, coupling the first input wire to the true input. Each of the N write circuits also includes second and third transistors, coupled in series to the complement input. The first input wire is also coupled to the third transistor to selectively turn on the third transistor to provide a complement of the binary value to the second transistor. Each of the N write circuits also includes a second input wire, coupled to the first and second transistors, that selectively turns on the first and second transistors to selectively enable writing the binary value to the storage element.

In another aspect, it is a feature of the present invention to provide a register cell. The register cell includes a storage element that stores a bit. The register cell also includes N write ports. Each of the N write ports includes exactly two metal wires. The register cell also includes N write circuits. Each of the N write circuits couples a corresponding one of the N write ports to the storage element. Each of the N write circuits includes exactly three transistors.

In another aspect, it is a feature of the present invention to provide a multi-ported register cell. The multi-ported register cell includes a storage element that stores a bit. The multi-ported register cell also includes N sets of only three transistors for writing the bit into the storage element. Each of the N sets of only three transistors is coupled to the storage element. The multi-ported register cell also includes N sets of only two metal wires for writing the bit into the storage element. Each of the N sets of only two metal wires is coupled to a corresponding one of the N sets of only three transistors.

An advantage of the present invention is that it significantly reduces the number of metal wires required per write port over some conventional register cells. This has the advantageous benefit of reducing metal wire congestion in a register file comprised of many of the cells. Additionally, the present invention reduces the number of transistors, and therefore semiconductor layer space, required per write port significantly over other conventional register cells. Consequently, the register cell of the present invention is smaller than conventional register cells. The reduction in metal wire congestion and register cell size reduces the overall size of the register file, which consequently potentially reduces the overall die size of a processor including the register cell of the present invention.

Other features and advantages of the present invention will become apparent upon study of the remaining portions of the specification and drawings.

DETAILED DESCRIPTION

Throughout the instant disclosure, when circuit elements are described as being "coupled", the term "coupled" means that the elements are directly connected together, such as by a metal wire or semiconductor material. Alternatively, the term "coupled" means the elements are indirectly connected through another circuit element.

Figure 1:
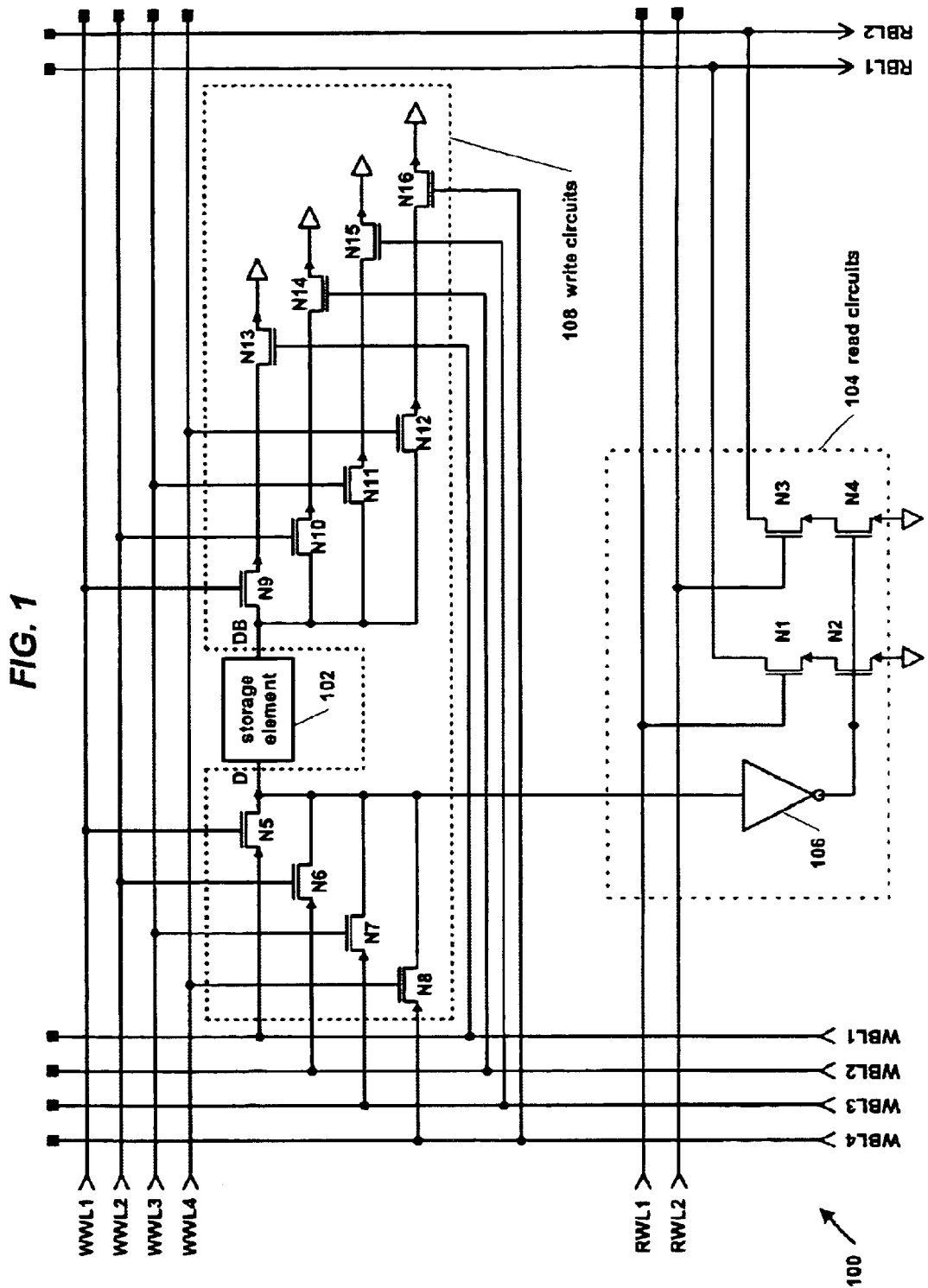
FIG. 1 is a block diagram of a multi-ported register cell according to the present invention.

Referring now to FIG. 1, a block diagram of a multi-ported register cell 100 according to the present invention is shown. The embodiment of register cell 100 shown in FIG. 1 includes four write ports and two read ports. However, the transistor configuration of register cell 100 may be adapted to include other numbers of read ports and write ports and still enjoy the advantages of the present invention.

Register cell 100 includes a storage element 102, or storage transistors 102. Storage element 102 is configured to store a single bit of data of a register, such as a register in a register file. Storage element 102 includes a true input/output line and a complement input/output line, denoted D and DB, respectively. Multiple ones of register cell 100 may be coupled together to form a multi-port register that stores multiple bits. Multiple registers comprised of register cell 100 may be coupled together to form a multi-port register file.

The register file is multi-ported because more than one functional block may write and/or read registers in the register file simultaneously. In particular, a multi-ported register file comprised of register cells of the embodiment of FIG. 1 allows four different functional blocks within the microprocessor to write to four different registers in the register file simultaneously. Similarly, two different functional blocks within the microprocessor may read two different registers in the register file simultaneously. Furthermore, a given register in the register file may be read and written simultaneously.

Figure 2:
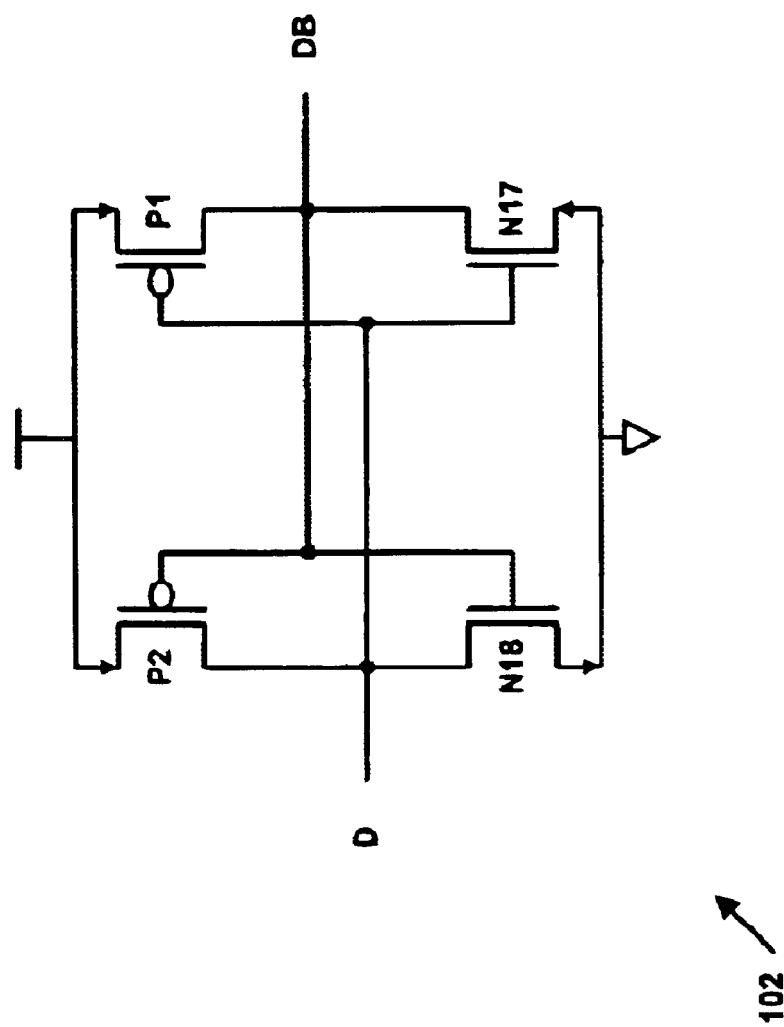
FIG. 2 is a block diagram of the storage element of FIG. 1 according to the present invention.

Referring now to FIG. 2, a block diagram of storage element 102 of FIG. 1 is shown. Storage element 102 includes two N-channel MOS devices, denoted N17 and N18, and two P-channel MOS devices, denoted P1 and P2. The sources of N17 and N18 are coupled to $V_{ss}$, or ground. The sources of P1 and P2 are coupled to $V_{dd}$. The drain of N18 is coupled to the drain of P2, both of which are coupled to true input/output D and to the gates of P1 and N17. The drain of N17 is coupled to the drain of P1, both of which are coupled to complementary input/output DB and to the gates of P2 and N18. As configured, N17, N18, P1, and P2 operate collectively to store a single bit value, which is written via true input D and/or complementary input DB, and which is read via true output D, as discussed below.

The coupling of the gates and drains of N17 and P1 create an inverter whose input is D and whose output is DB. Similarly, the coupling of the gates and drains of N18 and P2 create an inverter whose input is DB and whose output is D. The output of each of the inverters is coupled to the input of the other inverter, thereby creating a circuit for storing a bit value on node D.

Referring again to FIG. 1, register cell 100 also includes four write wordline (WWL) horizontal metal wires denoted WWL1, WWL2, WWL3, and WWL4. WWL1-4 are control signals used to write a register made up of cells like cell 100. In a typical register, WWL1-4 are coupled to each of the cells 100. The processor generates a high value on one of WWL1-4 to write a new value to the register.

Register cell 100 also includes two read wordline (RW1) horizontal metal wires denoted RWL1 and RWL2. RWL1-2 are control signals used to read a register made up of cells like cell 100. In a typical register, RWL1-2 are coupled to each of the cells 100. The processor generates a high value on one or both of RWL1-2 to read the value stored in the register.

Register cell 100 also includes four write bitline (WBL) vertical metal wires denoted WBL1, WBL2, WBL3, and WBL4. WBL1-4 are data signals used to write a bit value into storage element 102 of a register made up of cells like cell 100. Multiple sets of WBL1-4 are arranged together into a data bus for writing a data value, such as a 64-bit value, into the register. The processor generates a one or zero value on one of each of the 64 sets of WBL1-4 in the data bus to write the 64-bit value into the register.

Register cell 100 also includes two read bitline (RBL) vertical metal wires denoted RBL1 and RBL2. RBL1-2 are data signals used to read a bit value from storage element 102 of a register made up of cells like cell 100. Multiple sets of RBL1-4 are arranged together into a data bus for reading a data value, such as a 64-bit value, from the register. The processor reads a one or zero value from one or both of each of the 64 sets of RBL1-2 in the data bus to read the 64-bit value from the register.

Collectively, WWL1 and WBL1 comprise write port 1. Similarly, WWL2 and WBL2 comprise write port2, WWL3 and WBL3 comprise write port3, and WWL4 and WBL4 comprise write port4. Collectively, RWL1 and RBL1 comprise read port1, and RWL2 and RBL2 comprise read port2.

Register cell 100 also includes four N-channel MOS devices, denoted N5 through N8. The drains of N5 through N8 are coupled to the D input/output of storage element 102. The gates of N5 through N8 are coupled to WWL1 through WWL4, respectively. The sources of N5 through N8 are coupled to WBL1 through WBL4, respectively.

Register cell 100 also includes four N-channel MOS devices, denoted N9 through N12. The drains of N9 through N12 are coupled to the DB input/output of storage element 102. The gates of N9 through N12 are coupled to WWL1 through WWL4, respectively.

Register cell 100 also includes four N-channel MOS devices, denoted N13 through N16. The drains of N13 through N16 are coupled to the sources of N9 through N12, respectively. That is, N9 through N12 are coupled in series to N13 through N16, respectively. The gates of N13 through N16 are coupled to WBL1 through WBL4, respectively. The sources of N13 through N16 are coupled to $V_{ss}$.

N5 through N16 collectively comprise four write circuits 108. One of the write circuits 108 is comprised of N5, N9, and N13. Another of the write circuits 108 is comprised of N6, N10, and N14. Another of the write circuits 108 is comprised of N7, N11, and N15. Another of the write circuits 108 is comprised of N8, N12, and N16.

The coupling of N5 through N16, storage element 102, WBL1-4 and WWL1-4 as described enables storage element 102 to be written by any of four functional blocks. For example, assume a functional block coupled to write port 3 desires to write a high value, i.e., a binary one, to storage element 102. The functional block asserts a high value on WWL3 and a high value on WBL3, i.e., the functional block charges WWL3 and WBL3 to a value substantially near $V_{dd}$. The high value on WBL3 causes N15 to be turned on and the high value on WWL3 causes N11 to be turned on. Consequently, a discharge path to ground is provided for the complementary DB input/output of storage element 102, causing a high value to be stored into storage element 102 since N17 and P1 of the storage element 102 FIG. 2 will invert the low value received at the complementary DB input/output and storage element 102 will store the inverted value, i.e., will store a high value on the true D input/output node. Stated alternatively, because WBL3 is high, N15 provides a low value on its drain. The high value on WWL3 turns on N11, and N11 provides the low value received on its source from the drain of N15 to complementary input/output DB of storage element 102.

Conversely, assume a functional block coupled to write port 3 desires to write a low value, i.e., a binary zero, to storage element 102. The functional block asserts a high value on WWL3 and a low value on WBL3, i.e., the functional block charges WWL3 to a value substantially near $V_{dd}$ and discharges WBL3 to a value substantially near $V_{ss}$. The high value on WWL3 turns on N7. Consequently, N7 provides a discharge path for the true D input/output of storage element 102, causing a low value to be stored into storage element 102.

Register cell 100 also includes an inverter 106. The input of inverter 106 is coupled to the true input/output D of storage element 102.

Register cell 100 also includes two N-channel MOS devices, denoted N1 and N2. The drain of N1 is coupled to RBL1. The gate of N1 is coupled to RWL1. The source of N1 is coupled to the drain of N2. The drain of N2 is coupled to $V_{ss}$. The gate of N2 is coupled to the output of inverter 106.

Register cell 100 also includes two N-channel MOS devices, denoted N3 and N4. The drain of N3 is coupled to RBL2. The gate of N3 is coupled to RWL2. The source of N3 is coupled to the drain of N4. The drain of N4 is coupled to $V_{ss}$. The gate of N4 is coupled to the output of inverter 106.

Collectively, N1 through N4 and inverter 106 are referred to as read circuits 104. One of the read circuits 104 is comprised of inverter 106, N1, and N2. Another of the read circuits 104 is comprised of inverter 106, N3, and N4.

In one embodiment, register cell 100 operates according to a two-phase clock. In one embodiment, RBL1 and RBL2 are left floating during phase 1 and are pre-charged to a high value during phase 2. Read circuits 104 enable storage element 102 to be read by either or both of two functional blocks.

Assume, for example, a functional block coupled to read port 2 desires to read the value stored in storage element 102. Assume further that the value stored in storage element 102 is a low value. The functional block asserts a high value on RWL2. Inverter 106 receives the low value from storage element 102 and generates a high value on its output, which is received by the gate of N4. The high value on the output of inverter 106 causes N4 to turn on, and the high value on RWL2 causes N3 to turn on; consequently, a discharge path to ground is provided to node RBL2. Consequently, the high value that was pre-charged on RBL2 during phase 2 discharges to a low value during phase 1 via the path through N3 and N4. Hence, the functional block reads a binary zero on read port 2 from storage element 102.

Conversely, assume the value stored in storage element 102 is a high value. The functional block asserts a high value on RWL2 to read the bit stored in storage element 102. Inverter 106 receives the high value from storage element 102 and generates a low value on its output, which is received by the gate of N4. The low value on the output of inverter 106 causes N4 not to be turned on. Hence, although the high value on RWL2 causes N3 to turn on, no discharge path is provided to node RBL2. Consequently, the high value that was pre-charged on RBL2 during phase 2 remains at a high value during phase 1. Hence, the functional block reads a binary one on read port 2 from storage element 102.

In order to appreciate the advantages of the present invention more fully, four prior art register cells will now be described in FIGS. 3 through 6. Each of the cells in FIGS. 3 through 6 includes four write ports and two read ports for ready comparison with cell 100 of FIG. 1. The register cells of FIGS. 3 through 6 are similar is some ways to register cell 100 of FIG. 1, and like elements are numbered the same for simplicity and clarity.

Figure 3:
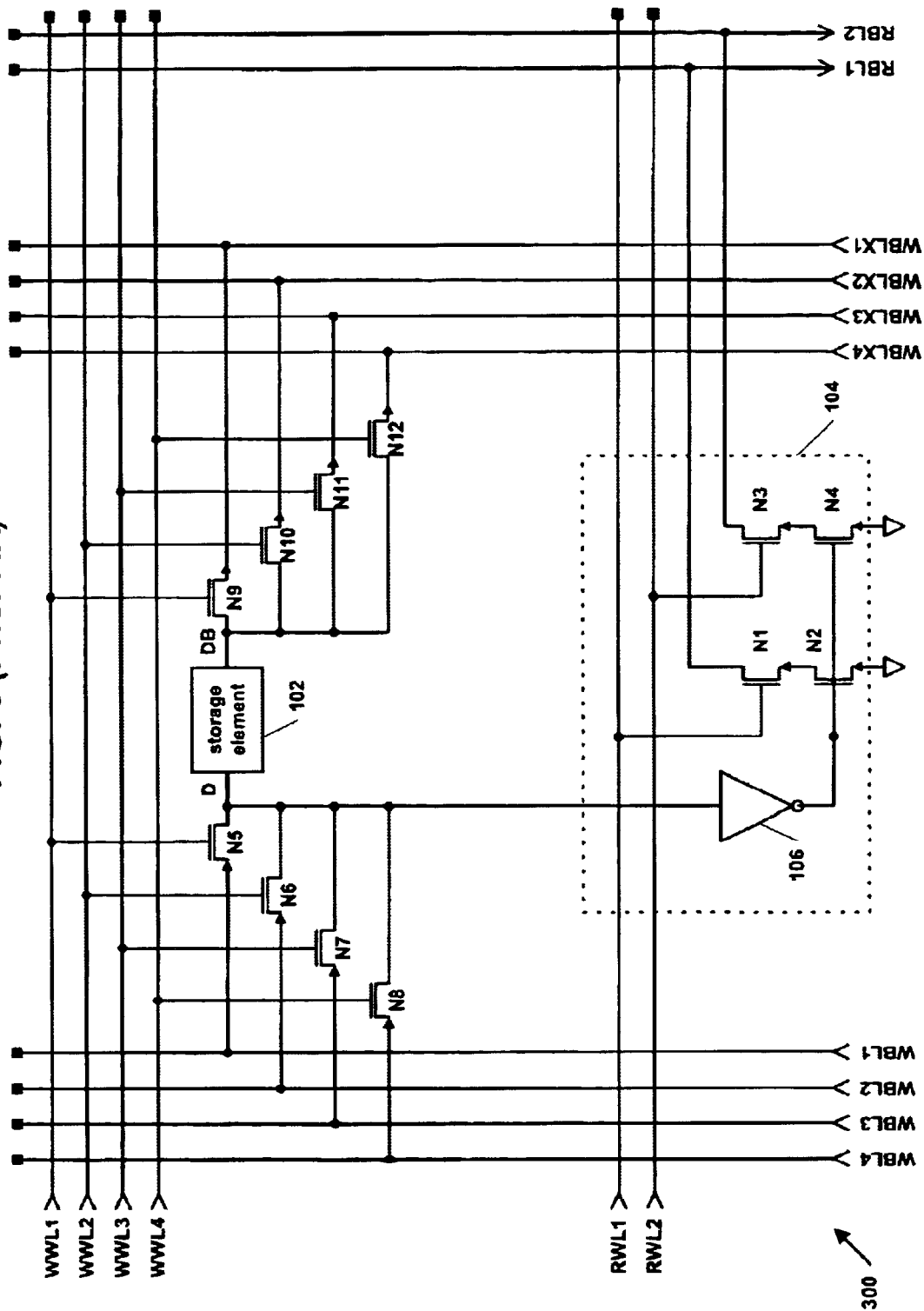
FIGS. 3 through 6 are block diagrams illustrating prior art register cells.

Referring now to FIG. 3, a block diagram illustrating a prior art register cell 300 is shown. Register cell 300 includes a storage element 102, two read circuits 104, RWL1-2, RBL1-2, WWL1-4, WBL1-4, and N5-12, as in register cell 100 of FIG. 1. However, register cell 300 does not include N13-N16 of register cell 100. Instead, register cell 300 includes four inverse write bitline (WBLX) vertical metal wires denoted WBLX1, WBLX2, WBLX3, and WBLX4, coupled to the source of N9, N10, N11, and N12, respectively. WBLX1-4 provide the complement value of WBL1-4, respectively, to N9-N12, respectively. The complement values are generated by circuitry outside cell 300.

As may be observed, each of the write ports of cell 300 has 3 metal wires; whereas, cell 100 of FIG. 1 has only 2 metal wires per write port. A disadvantage of cell 300 is that it contains a relatively large number of metal wires. In particular, cell 300 contains four more metal wires for writing the bit value into storage element 102 than cell 100, which potentially causes the size of cell 300 to be larger than the size of cell 100, and increases metal layer congestion.

Figure 4:
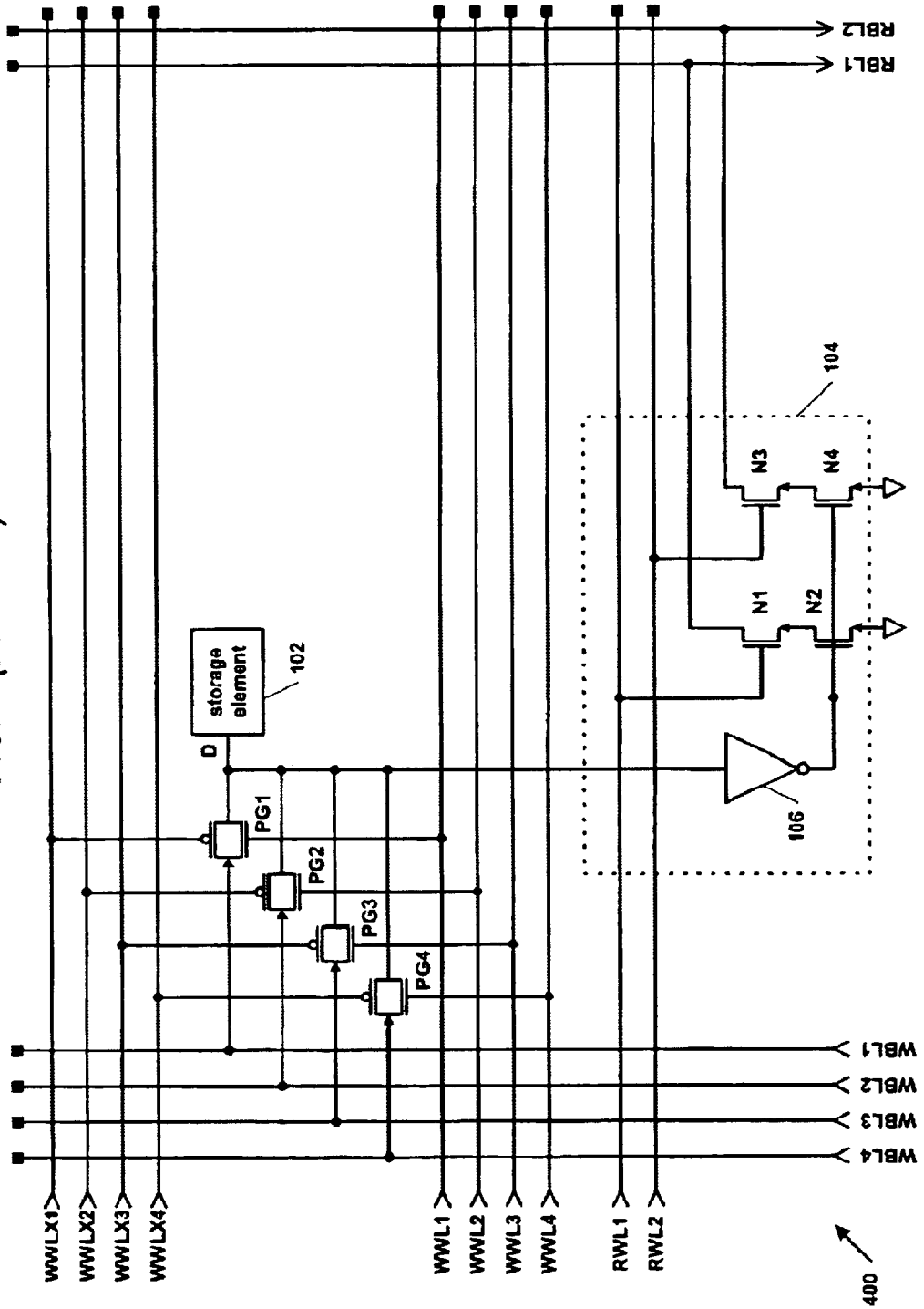

Referring now to FIG. 4, a block diagram illustrating a prior art register cell 400 is shown. Register cell 400 includes a storage element 102, two read circuits 104, RWL1-2, RBL1-2, WWL1-4, and WBL1-4, as in register cell 100 of FIG. 1. However, register cell 400 does not include N5-N16 of register cell 100. Instead, register cell 400 includes four passgates, or transmission gates, denoted PG1, PG2, PG3, and PG4. PG1-4 are comprised of an N-channel and a P-channel transistor coupled in parallel such that the sources of the two transistors are coupled together and the drains of the two transistors are coupled together. The drains of PG1-4 are coupled to true input/output D of storage element 102. The sources of PG1-4 are coupled to WBL1-4, respectively. WWL1-4 are coupled to the gates of the N-channel transistors of PG1-4, respectively.

Register cell 400 also includes four inverse write wordline (WWLX) horizontal metal wires denoted WWLX1, WWLX2, WWLX3, and WWLX4, coupled to the gates of the P-channel transistors of PG1-4, respectively. WBLX1-4 transmit the complement value of WBL1-4, respectively. The complement values are generated by circuitry outside cell 400.

As may be observed, each of the write ports of cell 400 has 3 metal wires; whereas, cell 100 of FIG. 1 has only 2 metal wires per write port. A disadvantage of cell 400 is that it contains a relatively large number of metal wires. In particular, cell 400, like cell 300 of FIG. 3, contains four more metal wires for writing the bit value into storage element 102 than cell 100, which potentially causes the size of cell 400 to be larger than the size of cell 100, and increases metal layer congestion.

Figure 5:
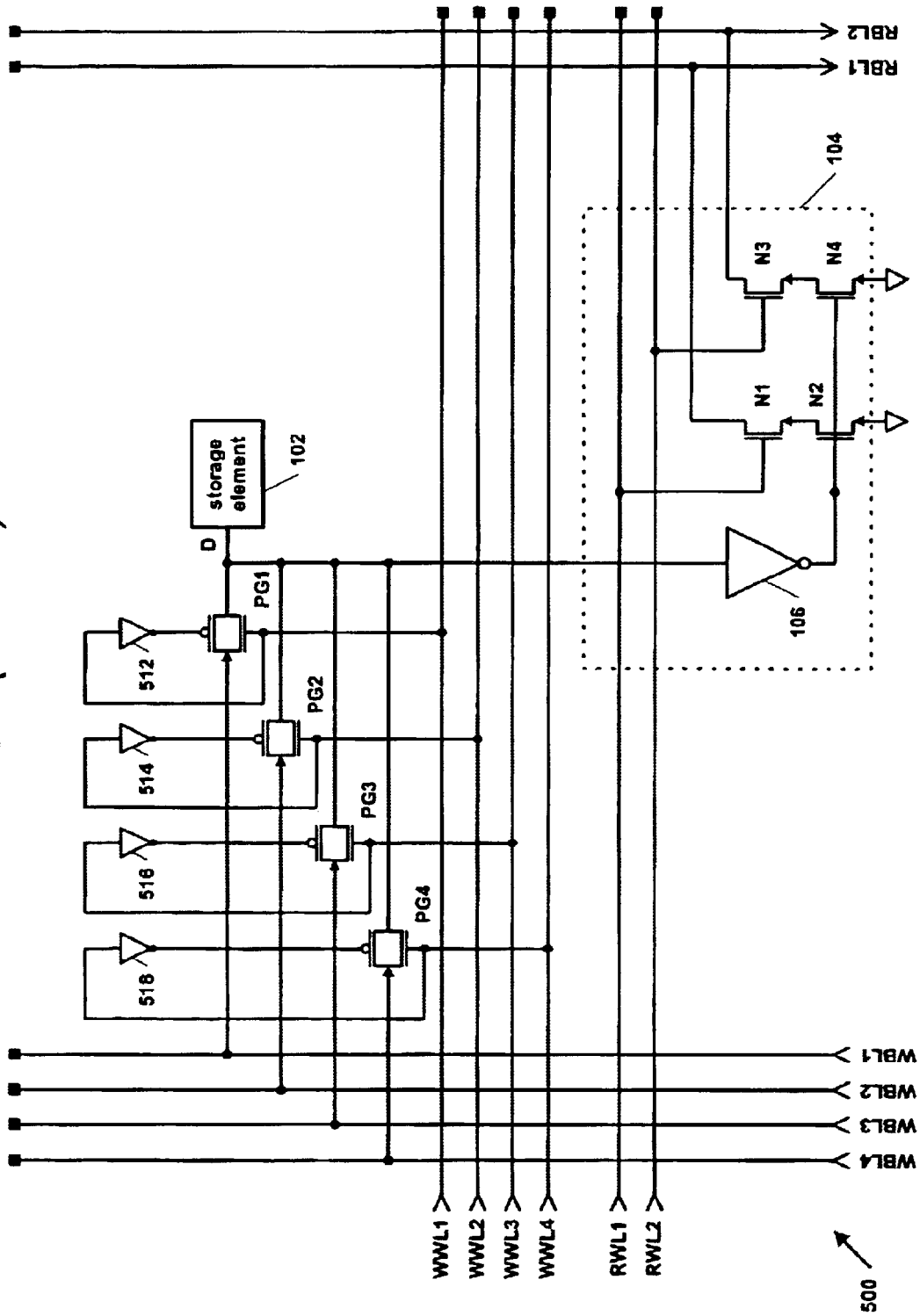

Referring now to FIG. 5, a block diagram illustrating a prior art register cell 500 is shown. Register cell 500 includes a storage element 102, two read circuits 104, RWL1-2, RBL1-2, WWL1-4, and WBL1-4, as in register cell 100 of FIG. 1. However, register cell 500 does not include N5-N16 of register cell 100. Instead, register cell 500 includes four passgates, similar to cell 400 of FIG. 4, denoted PG1, PG2, PG3, and PG4. Register cell 500 also include four inverters, denoted 512, 514, 516, and 518. Register cell 500 does not include metal wires WWLX1-4 of cell 400 of FIG. 4. Instead, the gates of the P-channel transistors of PG1-4 are coupled to the outputs of inverters 512, 514, 516, and 518, respectively, and the inputs of inverters 512, 514, 516, and 518 are coupled to WWL1-4, respectively.

As may be observed, a disadvantage of cell 500 is that, although it contains the same number of metal wires as cell 100 of FIG. 1, it contains more transistors than cell 100. In particular, assuming the inverters 512 through 516 of cell 500 comprise at least two transistors, cell 500 contains at least four more transistors for writing the bit value into storage element 102 than cell 100, which potentially causes the size of cell 500 to be larger than the size of cell 100.

Figure 6:
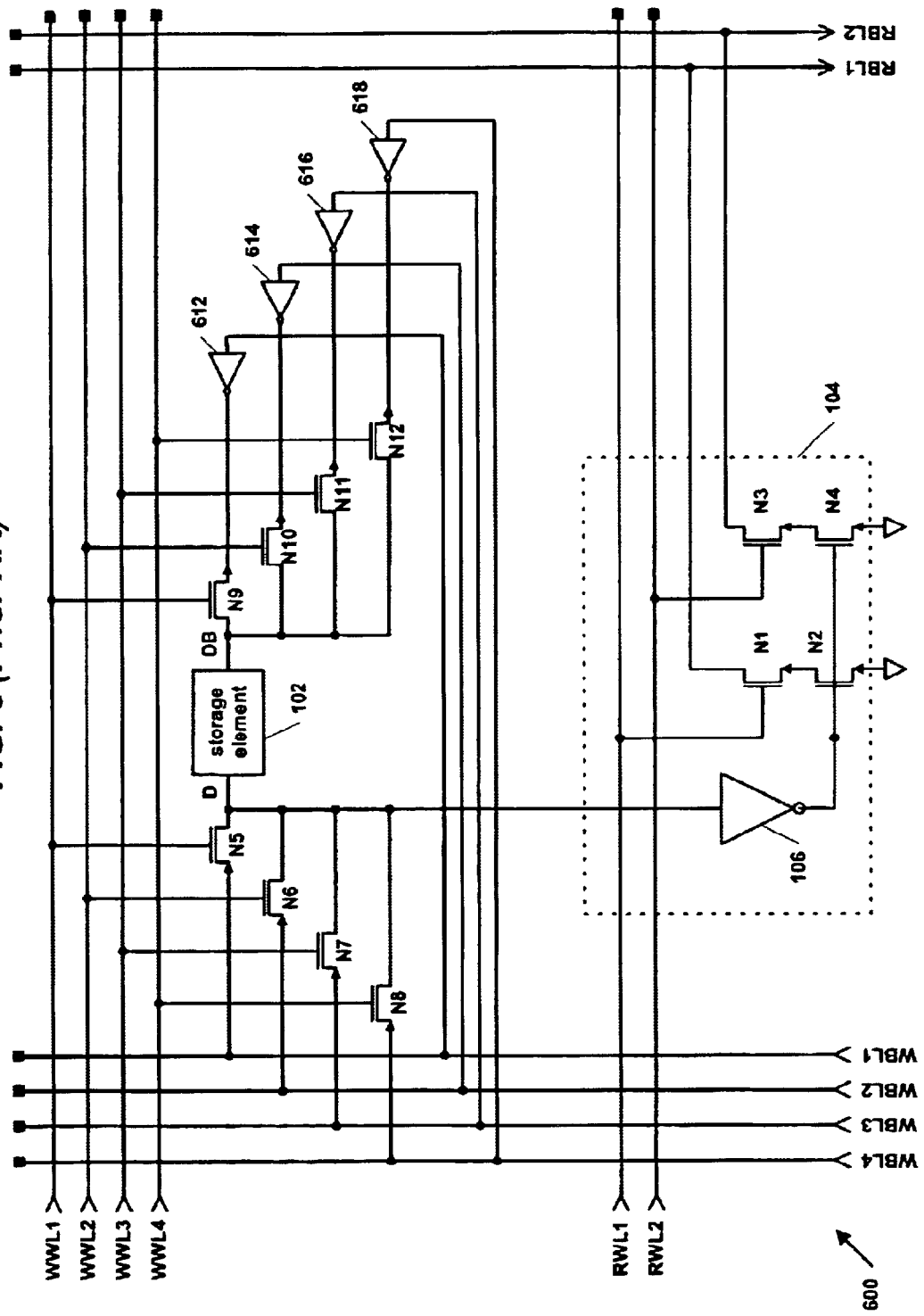

Referring now to FIG. 6, a block diagram illustrating a prior art register cell 600 is shown. Register cell 600 includes a storage element 102, two read circuits 104, RWL1-2, RBL1-2, WWL1-4, WBL1-4, and N5-12, as in register cell 100 of FIG. 1. However, register cell 300 does not include N13-N16 of register cell 100. Instead, register cell 300 includes four inverters, denoted 612, 614, 616, and 618. The sources of N9-N12 are coupled to the outputs of inverters 612, 614, 616, and 618, respectively, and the inputs of inverters 612, 614, 616, and 618 are coupled to WBL1-4, respectively.

As may be observed, a disadvantage of cell 600 is that, although it contains the same number of metal wires as cell 100 of FIG. 1, it contains more transistors than cell 100. In particular, assuming the inverters 612 through 616 of cell 600 comprise at least two transistors, cell 600 contains at least four more transistors for writing the bit value into storage element 102 than cell 100, which potentially causes the size of cell 600 to be larger than the size of cell 100.

Although the present invention and its objects, features, and advantages have been described in detail, other embodiments are encompassed by the invention. For example, although the present invention has been described with an embodiment having four write ports and two read ports, the invention is adaptable to register cells having various numbers of write ports and read ports.

Those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. A register cell, comprising:
   a storage element, having true and complement inputs; and
   N write circuits, each coupled to said storage element, each comprising:
   a first input wire, for transmitting a binary value to write into said storage element;
   a first transistor, coupling said first input wire to said true input;
   second and third transistors, coupled in series to said complement input, wherein said first input wire is also coupled to said third transistor to selectively turn on said third transistor to provide a complement of said binary value to said second transistor; and
   a second input wire, coupled to said first and second transistors, for selectively turning on said first and second transistors to selectively enable writing said binary value to said storage element.

2. The register cell of claim 1, wherein said first and second input wires comprise the only input wires to each of said N write circuits.

3. The register cell of claim 2, wherein said first, second, and third transistors comprise the only transistors in each of said N write circuits.

4. The register cell of claim 1, wherein said first, second, and third transistors comprise the only transistors in each of said N write circuits.

5. The register cell of claim 4, wherein said first and second input wires comprise the only input wires to each of said N write circuits.

6. The register cell of claim 1, wherein said N is greater than 2.

7. The register cell of claim 1, wherein a drain of said second transistor is coupled to said complement input.

8. The register cell of claim 7, wherein a source of said third transistor is coupled to ground.

9. The register cell of claim 8, wherein a source of said second transistor is coupled to a drain of said third transistor.

10. The register cell of claim 1, wherein said first, second, and third transistors comprise metal oxide semiconductor (MOS) devices.

11. The register cell of claim 10, wherein said first, second, and third transistors comprise n-channel MOS devices.

12. The register cell of claim 1, further comprising:
M read circuits, coupled to said storage element, for reading said binary value from said storage element.

13. The register cell of claim 12, wherein said M is greater than 1.

14. The register cell of claim 13, wherein each of said M read circuits comprises:
an output wire, for reading said binary value from said storage element; and
read circuitry, coupling said true input to said output wire.

15. The register cell of claim 14, wherein each of said M read circuits further comprises:
a third input wire, coupled to said read circuitry, for selectively turning on a transistor in said read circuitry to selectively enable reading said binary value from said storage element.

16. A register cell, comprising:
a storage element, having true and complement inputs; and
N write circuits, each coupled to said storage element, each consisting essentially of:
a first input wire, for transmitting a binary value to write into said storage element;
a first transistor, coupling said first input wire to said true input;
second and third transistors, coupled in series to said complement input, wherein said first input wire is also coupled to said third transistor to selectively turn on said third transistor to provide a complement of said binary value to said second transistor; and
a second input wire, coupled to said first and second transistors, for selectively turning on said first and second transistors to selectively enable writing said binary value to said storage element.

17. The register cell of claim 16, wherein said N is greater than 2.

18. A register cell, consisting essentially of:
a storage element, having true and complement inputs;
N write circuits, each coupled to said storage element, each comprising:
a first input wire, for transmitting a binary value to write into said storage element;
a first transistor, coupling said first input wire to said true input;
second and third transistors, coupled in series to said complement input, wherein said first input wire is also coupled to said third transistor to selectively turn on said third transistor to provide a complement of said binary value to said second transistor; and
a second input wire, coupled to said first and second transistors, for selectively turning on said first and second transistors to selectively enable writing said binary value to said storage element; and
M read circuits, coupled to said storage element.

19. The register cell of claim 18, wherein said N is greater than 2.

20. The register cell of claim 19, wherein said M is greater than 1.

21. A register cell, comprising:
a storage element, for storing a bit;
N write ports, each comprising exactly two metal wires; and
N write circuits, each coupling a corresponding one of said N write ports to said storage element, each comprising exactly three transistors.

22. The register cell of claim 21, wherein a first of said exactly two metal wires transmits a first signal to selectively turn on first and second of said exactly three transistors to selectively update said bit in said storage element.

23. The register cell of claim 22, wherein a second of said exactly two metal wires transmits a value to which said bit is selectively updated.

24. The register cell of claim 23, wherein said value transmitted on said second of said exactly two metal wires also selectively turns on a third of said exactly three transistors in order to provide a complement of said value to said second of said exactly three transistors.

25. The register cell of claim 24, wherein said storage element has a first input coupled to said first of said exactly three transistors and a second input coupled to said second of said exactly three transistors.

26. The register cell of claim 25, wherein said second transistor selectively provides said complement of said value to said storage element for selectively updating said bit.

27. The register cell of claim 22, wherein said first of said exactly two metal wires of said N write ports collectively determine which of said N write ports update said storage element.

28. The register cell of claim 21, wherein said N is greater than 2.

29. The register cell of claim 21, wherein said N is 4.

30. The register cell of claim 28, further comprising:
at least two read circuits, coupled to said storage element, for reading said bit value from said storage element.

31. A multi-ported register cell, comprising:
a storage element, for storing a bit;
N sets of only three transistors, each of said N sets of only three transistors coupled to said storage element, for writing said bit into said storage element; and
N sets of only two metal wires, each of said N sets of only two metal wires coupled to a corresponding one of said N sets of only three transistors, for writing said bit into said storage element.

32. The register cell of claim 31, wherein said N is greater than 2.

33. The register cell of claim 31, wherein said N is 4.

34. The register cell of claim 31, wherein for each of said N sets of only three transistors, a first of said only three transistors is coupled to a true input of said storage element for providing said bit for writing into said storage element.

35. The register cell of claim 34, wherein for each of said N sets of only three transistors, a second of said only three transistors is coupled to a complement input of said storage element for providing a complement of said bit for writing into said storage element.

36. The register cell of claim 35, wherein for each of said N sets of only three transistors, a third of said only three transistors is coupled to said second of said only three transistors for providing said complement of said bit to said second of said only three transistors.

37. The register cell of claim 36, wherein for each of said N sets of only three transistors and said corresponding one of said N sets of only two metal wires, a first of said only two metal wires transmits said bit for writing into said storage element.

38. The register cell of claim 37, wherein for each of said N sets of only three transistors and said corresponding one of said N sets of only two metal wires, said first of said only two metal wires is coupled to a gate of said third of said only three transistors, wherein said first of said only two metal wires selectively turns on said third of said only three transistors to selectively provide said complement of said bit to said second of said only three transistors.

39. The register cell of claim 31, further comprising:
at least two read circuits, coupled to said storage element, for reading said bit value from said storage element.

40. The register cell of claim 39, wherein said at least two read circuits comprises two read circuits.

* * * * *